(12) United States Patent
Bora et al.

(10) Patent No.: US 11,184,002 B2
(45) Date of Patent: Nov. 23, 2021

(54) SWITCH DEVICE FOR SWITCHING AN ANALOG ELECTRICAL INPUT SIGNAL

(71) Applicant: Fraunhofer-Gesellschaft zur Foerderung der angewandten Forschung e.V., Munich (DE)

(72) Inventors: Pragoti Pran Bora, Munich (DE); David Borggreve, Munich (DE); Frank Vanselow, Munich (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 158 days.

(21) Appl. No.: 16/719,910

(22) Filed: Dec. 18, 2019

(65) Prior Publication Data
US 2020/0127659 A1 Apr. 23, 2020

Related U.S. Application Data

(63) Continuation of application No. PCT/EP2018/069156, filed on Jul. 13, 2018.

(30) Foreign Application Priority Data

Jul. 14, 2017 (EP) .................................... 17181434

(51) Int. Cl.
*H03K 17/00* (2006.01)
*H03K 17/687* (2006.01)
(Continued)

(52) U.S. Cl.
CPC ......... *H03K 17/161* (2013.01); *H03K 17/102* (2013.01); *H03K 17/284* (2013.01); *H03K 17/687* (2013.01); *H03K 17/08* (2013.01)

(58) Field of Classification Search
None
See application file for complete search history.

(56) References Cited

U.S. PATENT DOCUMENTS 7,183,814 B2 * 2/2007 Kudo ................... H03K 17/063
327/91
7,274,222 B2 * 9/2007 Alacoque ............. G11C 27/024
327/427

(Continued)

FOREIGN PATENT DOCUMENTS

JP 2009005187 A 1/2009

OTHER PUBLICATIONS

"U.C. Berkeley, EE247", Lecture 19, ADC Converters, Lecture Notes, 2006.

(Continued)

*Primary Examiner* — Kenneth B Wells
(74) *Attorney, Agent, or Firm* — Perkins Coie LLP; Michael A. Glenn

(57) ABSTRACT

A switch device for switching an analog electrical input signal includes: a switching transistor being a flipped-well-silicon-on-insulator-NMOS transistor; and a bootstrapping arrangement including a voltage providing arrangement for providing a floating voltage during the on-state, wherein the floating voltage is provided at a positive terminal and at a negative terminal of the voltage providing arrangement; wherein the bootstrapping arrangement is configured in such way that during the on-state the positive terminal is electrically connected to the front gate contact of the switching transistor and to the back gate contact of the switching transistor, and the negative terminal is electrically connected to the source contact of the switching transistor; wherein the bootstrapping arrangement is configured in such way that during the off-state the positive terminal and the negative (Continued)

terminal are not electrically connected to the switching transistor.

11 Claims, 8 Drawing Sheets

(51) Int. Cl.
*G11C 27/00* (2006.01)
*G11C 27/02* (2006.01)
*H03K 17/16* (2006.01)
*H03K 17/10* (2006.01)
*H03K 17/284* (2006.01)
*H03K 17/08* (2006.01)

(56) References Cited

U.S. PATENT DOCUMENTS

| | | | | |
|---|---|---|---|---|
| 7,710,164 | B1 * | 5/2010 | Sharma | H03K 17/063 327/94 |
| 8,593,181 | B2 * | 11/2013 | Ali | H03K 17/00 327/94 |
| 9,584,112 | B2 * | 2/2017 | Tang | H03K 17/687 |
| 10,295,572 | B1 * | 5/2019 | Mai | H03M 1/124 |
| 10,784,764 | B2 * | 9/2020 | Jodka | H02M 1/08 |
| 2008/0315246 | A1 | 12/2008 | Ueno et al. | |
| 2013/0033302 | A1 | 2/2013 | Ali | |
| 2015/0188536 | A1 | 7/2015 | Tang et al. | |

OTHER PUBLICATIONS

"UTBB-FDSOI Design & Migration Methodology", STMicroelectronics.

Brunsilius, Janet et al., "A 16b 80MS/s 100mW 77.6dB SNR CMOS pipeline ADC", 2011 IEEE International Solid-State Circuits Conference, San Francisco, CA, 2011, pp. 186-188.

Carter, R et al., "22nm FDSOI technology for emerging mobile, Internet-of-Things, and RF applications", 2016 IEEE International Electron Devices Meeting (IEDM), San Francisco, CA, 2016, p. 2.2.1-2.2.4.

Dessouky, M et al., "Input switch configuration suitable for rail-to-rail operation of switched op amp circuits", in Electronics Letters, vol. 35, No. 1, Jan. 7, 1999, pp. 8-10.

Huang, Guanzhong et al., "A fast bootstrapped switch for high-speed high-resolution A/D converter", Circuits and Systems (APC-CAS), 2010 IEEE Asia Pacific Conference on. IEEE, 2010.

Liu, Chun-Cheng et al., "A 10-bit 50-MS/s SAR ADC With a Monotonic Capacitor Switching Procedure", in IEEE Journal of Solid-State Circuits, vol. 45, Issue: 4, Apr. 2010.

Moon, U et al., "Switched-capacitor circuit techniques in submicron low-voltage CMOS", VLSI and CAD, 1999. ICVC '99. 6th International Conference on, Seoul, 1999, pp. 349-358.

Nikolic, B et al., "Circuit Design in Nanoscale FDSOI Technologies", MIEL 2014, Belgrade, Serbia, May 12-14, 2014.

Razavi, Behzad , "The Bootstrapped Switch [A Circuit for All Seasons]", in IEEE Solid-State Circuits Magazine, vol. 7, No. 3, Sep. 15, 2015, pp. 12-15.

Steensgaard, Jesper , "Bootstrapped low-voltage analog switches", Circuits and Systems, 1999. ISCAS '99. Proceedings of the 1999 IEEE International Symposium on, Orlando, FL, 1999, pp. 29-32 vol. 2.

Weber, O et al., "14nm FDSOI technology for high speed and energy efficient applications", 2014 Symposium on VLSI Technology (VLSI-Technology): Digest of Technical Papers, Honolulu, HI, 2014, pp. 1-2.

* cited by examiner

SWITCH DEVICE FOR SWITCHING AN ANALOG ELECTRICAL INPUT SIGNAL

CROSS-REFERENCES TO RELATED APPLICATIONS

This application is a continuation of copending International Application No. PCT/EP2018/069156, filed Jul. 13, 2018, which is incorporated herein by reference in its entirety, and additionally claims priority from European Application No. EP 17181434.6, filed Jul. 14, 2017, which is incorporated herein by reference in its entirety.

BACKGROUND OF THE INVENTION

The performance of many types of time-discrete circuits, such as switched-capacitor circuits, depends on the linearity of their analog switch transistor. A simple MOSFET device offers the functionality of such an analog switch transistor that can be controlled by a clock signal to either conduct or block signal-transfer between its source and drain terminals. However, the low break-down voltage of the thin gate-oxide and the low supply voltage due to the extensive scaling down in advanced CMOS processes, restrict the voltage swing on both the switched signal and the clock signal that drives the switch transistor. This limits the performance of the MOSFET device as an analog switch device. The design of reliable switch devices that can conduct as well as isolate while supporting sufficient signal swing has become a challenge.

In principle, an analog switch device has two operating regions; in the on-state it has a low resistance, allowing the analog signal to pass between two nodes, and in the off-state it has a high resistance to isolate the two nodes. Switches implemented in CMOS processes exhibit finite switch-resistance during the on-state. For conventional switches the value of the switch-resistance during the on-state is a non-linear function of the input voltage at its input contact. This non-ideality manifests itself as non-linear settling error resulting in distortion.

It is known to use bootstrapping techniques in analog switch devices for low supply-voltage applications in order to improve the performance of low-voltage analog switches [3, 4, 5, 6]. Although known conventional bootstrapping techniques improve the analog switch performance to a large extent by making the gate-to-source-voltage of the switching transistor constant during conduction, the non-linear input dependence of the switch-resistance of the switch device during the on-state still prevails due to body-effect [4].

SUMMARY

According to an embodiment, a switch device for switching an analog electrical input signal may have: a switching transistor being a flipped-well-silicon-on-insulator-N MOS transistor including a source contact being electrically connected to a source region, a drain contact being electrically connected to a drain region, a front gate contact being electrically connected to a gate region and a back gate contact being electrically connected to a flipped well; an input contact for receiving the analog electrical input signal, wherein the input contact is electrically connected to the source contact of the switching transistor; an output contact for outputting an analog electrical output signal corresponding to the analog electrical input signal during an on-state of the switch device and for not outputting the analog electrical output signal during an off-state of the switch device, wherein the output contact is electrically connected to the drain contact of the switching transistor; and a bootstrapping arrangement including a voltage providing arrangement for providing a constant floating voltage during the on-state, wherein the floating voltage is provided at a positive terminal and at a negative terminal of the voltage providing arrangement; wherein the bootstrapping arrangement is configured in such way that during the on-state; the positive terminal is electrically connected to the front gate contact of the switching transistor and to the back gate contact of the switching transistor, and the negative terminal is electrically connected to the source contact of the switching transistor; wherein the bootstrapping arrangement is configured in such way that during the off-state; the positive terminal and the negative terminal are not electrically connected to the switching transistor.

According to another embodiment, a sampler for an analog/digital converter may have: an inventive switching device.

According to yet another embodiment, an analog/digital converter may have: an inventive sampler.

The invention provides a switch device for switching an analog electrical input signal, wherein the switching device comprises:

a switching transistor being a flipped-well-silicon-on-insulator-NMOS transistor comprising a source contact being electrically connected to a source region, a drain contact being electrically connected to a drain region, a front gate contact being electrically connected to a gate region and a back gate contact being electrically connected to a flipped well;

an input contact for receiving the analog electrical input signal, wherein the input contact is electrically connected to the source contact of the switching transistor;

an output contact for outputting an analog electrical output signal corresponding to the analog electrical input signal during an on-state of the switch device and for not outputting the analog electrical output signal during an off-state of the switch device, wherein the output contact is electrically connected to the drain contact of the switching transistor; and a bootstrapping arrangement comprising a voltage providing arrangement for providing a constant floating voltage during the on-state, wherein the floating voltage is provided at a positive terminal and at a negative terminal of the voltage providing arrangement;

wherein the bootstrapping arrangement is configured in such way that during the on-state the positive terminal is electrically connected to the front gate contact of the switching transistor and to the back gate contact of the switching transistor, and the negative terminal is electrically connected to the source contact of the switching transistor;

wherein the bootstrapping arrangement is configured in such way that during the off-state the positive terminal and the negative terminal are not electrically connected to the switching transistor.

The threshold voltage, of a field-effect transistor, in particular of a NMOS transistor, is the minimum gate-to-source voltage differential that is needed to create a conducting path between the source contact and the drain contact. The threshold voltage ($V_{th}$) of the switching transistor in silicon-on-insulator technology has strong dependence on the back gate biasing voltage due to presence of the insulator, which is often a buried oxide (BOX) layer. Therefore, the back gate contact of such switching transistor can be effectively controlled to enhance their behavior as sampling switches.

A flipped-well NMOS transistor is one where the active-NMOS device is placed in an n-well instead of a conventional p-substrate or p-well. Hence, the well is "flipped". The choice of a flipped-well NMOS in silicon-on-insulator technology has the following advantages: The threshold voltage can be strongly controlled through the back gate contact in silicon-on-insulator transistors. In bulk-NMOS transistor, since the NMOS device is placed in a p-well, this would also involve a deep n-well to isolate it from the p-type substrate. This leads to more parasitic components at the well-substrate junctions and also additional cost factor due to the requirement of an extra mask. Due to a thick insulator layer, a voltage in the range of some volts, for example up to 2 V at the 22 nm FDSOI CMOS technology [2], can be applied to the back gate of the transistor. A positive voltage of the back gate with respect to the source leads to lowering of threshold voltage. This is also known as forward-body-biasing.

Bootstrapping in general refers to applying a constant voltage between two contacts of a device. A voltage between two contacts is a floating voltage, if none of the contacts is connected to a non-floating contact such as a supply voltage contact or ground contact.

According to the invention the floating voltage produced by the bootstrapping arrangement is applied during the on-state not only to the front gate contact of the switching transistor but also to the back gate contact of the switching transistor. In other words, the front gate contact and the back gate contact are shorted at least during the on-state. With this innovative arrangement, both, the front gate contact and the back gate contact are bootstrapped to the source contact during the on-state, wherein a voltage is applied which is equal to the sum of the floating voltage and a voltage of the input signal.

This leads to an improvement of the performance of the switching transistor because: The potential difference between the back gate contact and the source contact is the floating voltage which is constant. Since there is no variation of the threshold voltage with the voltage of the input signal, the switch-resistance during the on-state is also input-independent. A positive voltage between the back gate contact and the source gate contact leads to forward-body-biasing of the switching transistor. Due to this the threshold voltage of the switching transistor is reduced during the on-state which results in a reduction of the switch-resistance during the on-state. Hence, a target switch-resistance for the on-state of the switching transistor can be achieved with a smaller aspect ratio (width/length). This results in the reduction of area dependent issues like clock-feedthrough [11] and charge-injection [11].

According to an advantageous embodiment of the invention the switch device comprises a ground contact for providing a ground voltage;
wherein the bootstrapping arrangement is configured in such way that
during the on-state the front gate contact of the switching transistor and the back gate contact of the switching transistor are not electrically connected to the ground contact;
wherein the bootstrapping arrangement is configured in such way that during the off-state
the front gate contact of the switching transistor and the back gate contact of the switching transistor are electrically connected to the ground contact.

By these features the switch-resistance of the switching transistor may be stabilized at a maximum value during the off-state.

According to an advantageous embodiment of the invention the switch device comprises a positive supply voltage contact for providing a positive supply voltage;
wherein the voltage providing arrangement comprises a capacitor;
wherein the positive terminal is electrically connected to a positive contact of the capacitor;
wherein the negative terminal is electrically connected to a negative contact of the capacitor;
wherein the bootstrapping arrangement is configured in such way that during the on-state
the positive contact of the capacitor is not electrically connected to the positive supply voltage contact, and
the negative contact of the capacitor is not electrically connected to the ground contact;
wherein the bootstrapping arrangement is configured in such way that during the off-state
the positive contact of the capacitor is electrically connected to the positive supply voltage contact, and
the negative contact of the capacitor is electrically connected to the ground contact.

These features provide a simple and cost-effective implementation of the inventive switch device.

According to an advantageous embodiment of the invention the bootstrapping arrangement comprises a first switch for electrically connecting the positive contact of the capacitor to the positive supply voltage contact;
wherein the bootstrapping arrangement comprises a second switch for electrically connecting the negative contact of the capacitor to the ground contact;
wherein the bootstrapping arrangement comprises a third switch for electrically connecting the positive contact of the capacitor to the front gate contact of the switching transistor and to the back gate contact of the switching transistor;
wherein the bootstrapping arrangement comprises a fourth switch for electrically connecting the negative contact of the capacitor to the source contact of the switching transistor;
wherein the bootstrapping arrangement comprises a fifth switch for electrically connecting the ground contact to the front gate contact of the switching transistor and to the back gate contact of the switching transistor.

These features provide a simple and cost-effective implementation of the inventive switch device.

According to an advantageous embodiment of the invention the switches are controlled by one or more binary control signals. A binary control signal is a control signal which provides one signal level out of two signal levels. In particular, the one or more binary control signals may comprise one or more clock signals produced by a clock in order to switch repeatedly from the on-state to the off-state and back to the on-state.

According to an advantageous embodiment of the invention the switching transistor is a flipped-well fully depleted silicon-on-insulator NMOS transistor.

There are two types of silicon-on-insulator transistors: partially depleted silicon-on-insulator transistors and fully depleted silicon-on-insulator transistors. For a partially depleted silicon-on-insulator transistor the sandwiched film between the gate region and the insulator is large, so the depletion region can't cover the whole film. In contrast to that, the film is very thin in fully depleted silicon-On-insulator transistors so that the depletion region covers the whole film. The switching transistor may be manufactured in a 22 nm FDSOI CMOS process.

According to an advantageous embodiment of the invention the switching transistor comprises a buried insulator, wherein the source region, the drain region and the gate region are arranged at a first side of the buried insulator, and wherein the flipped-well is arranged at a second side of the buried insulator.

According to an advantageous embodiment of the invention the switching transistor comprises a substrate region, wherein the buried insulator is arranged at a first side of the flipped-well, and wherein the substrate region is arranged at a second side of the flipped well.

According to an advantageous embodiment of the invention the back gate contact is electrically connected to the front gate contact by a permanent electrical connection. An electrical connection may be considered as being permanent if the connection doesn't comprise any electrical switches or other electrically components which could disconnect and reconnect the electrical connection.

In a further aspect the invention provides a sampler for an analog/digital converter, wherein the sampler comprises a switching device.

In another aspect the invention provides an analog/digital converter, wherein
the analog/digital converter comprises a sampler.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
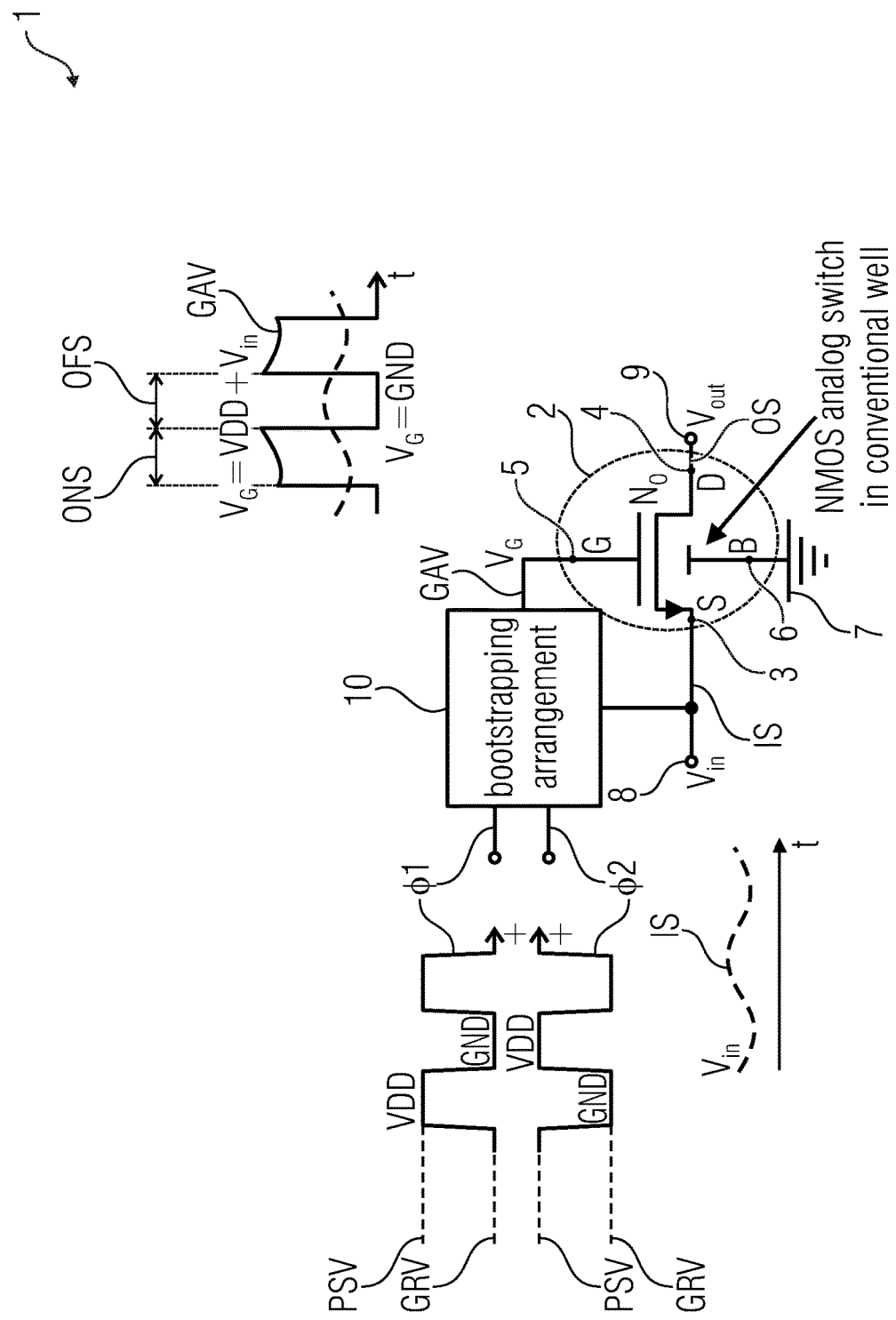
FIG. 1 illustrates a first embodiment of a switch device for switching an analog electrical input signal according to conventional technology in a schematic view.

Equal or equivalent elements or elements with equal or equivalent functionality are denoted in the following description by equal or equivalent reference numerals.

In the following description, a plurality of details is set forth to provide a more thorough explanation of embodiments of the present disclosure. However, it will be apparent to those skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

FIG. 1 illustrates a first embodiment of a switch device 1 for switching an analog electrical input signal IS according to conventional technology in a schematic view. The switch device 1 comprises a switching transistor 2 being a conventional bulk-NMOS transistor, which comprises a source contact 3, a drain contact 4, a front gate contact 5 and a bulk contact 6 being electrically connected to a ground contact 7. Furthermore, the switch device 1 comprises an input contact 8 for receiving the analog electrical input signal IS, wherein the input contact 8 is electrically connected to the source contact 3 of the switching transistor 2. Moreover, the switch device 1 comprises an output contact 9, which outputs an analog electrical output signal OS corresponding to the analog electrical input signal IS during an on-state ONS of the switch device 1 and which does not output the analog electrical output signal OS during an off-state OFS of the switch device 1, wherein the output contact 9 is electrically connected to the drain contact 4 of the switching transistor 2.

The bootstrapping arrangement 10 may provide a gate voltage GAV to the gate of the switching transistor 2 in such way, that the gate voltage is equal to a ground voltage GRV during the off-state OFS and that the gate voltage GAV is equal to the sum of a positive supply voltage PSV and the input signal IS during the on-state ONS.

The bootstrapping arrangement 10 may be controlled by a first binary control signal φ1, which is during the on-state ONS at a high level and during the off-state OFS at a low level, and a second binary control signal φ2, which is during the on-state ONS at a low level and during the off-state OFS at a high level. The low level may be for both signals φ1 and φ2 equal to the ground voltage GRV and the high level may be for both signals φ1 and φ2 equal to the positive supply voltage PSV.

In the embodiment of FIG. 1 the bulk contact 6, which is electrically connected to a p-well formed by a substrate of the switching transistor 2, is permanently connected to the ground contact 7. A disadvantage of such an embodiment is that bootstrapping in this case can only partially make the switch-resistance of the switching transistor 2 independent from the voltage of the input signal IS during the on-state ONS (see also [5]). The switch-resistance during the on-state ONS still has a non-linear dependence on the voltage of the input signal IS because the dependence of the threshold voltage on the voltage over input signal IS. This variation of the threshold voltage that depends upon the voltage variation between the source contact and the bulk contact is also called-"Body Effect".

Figure 2:
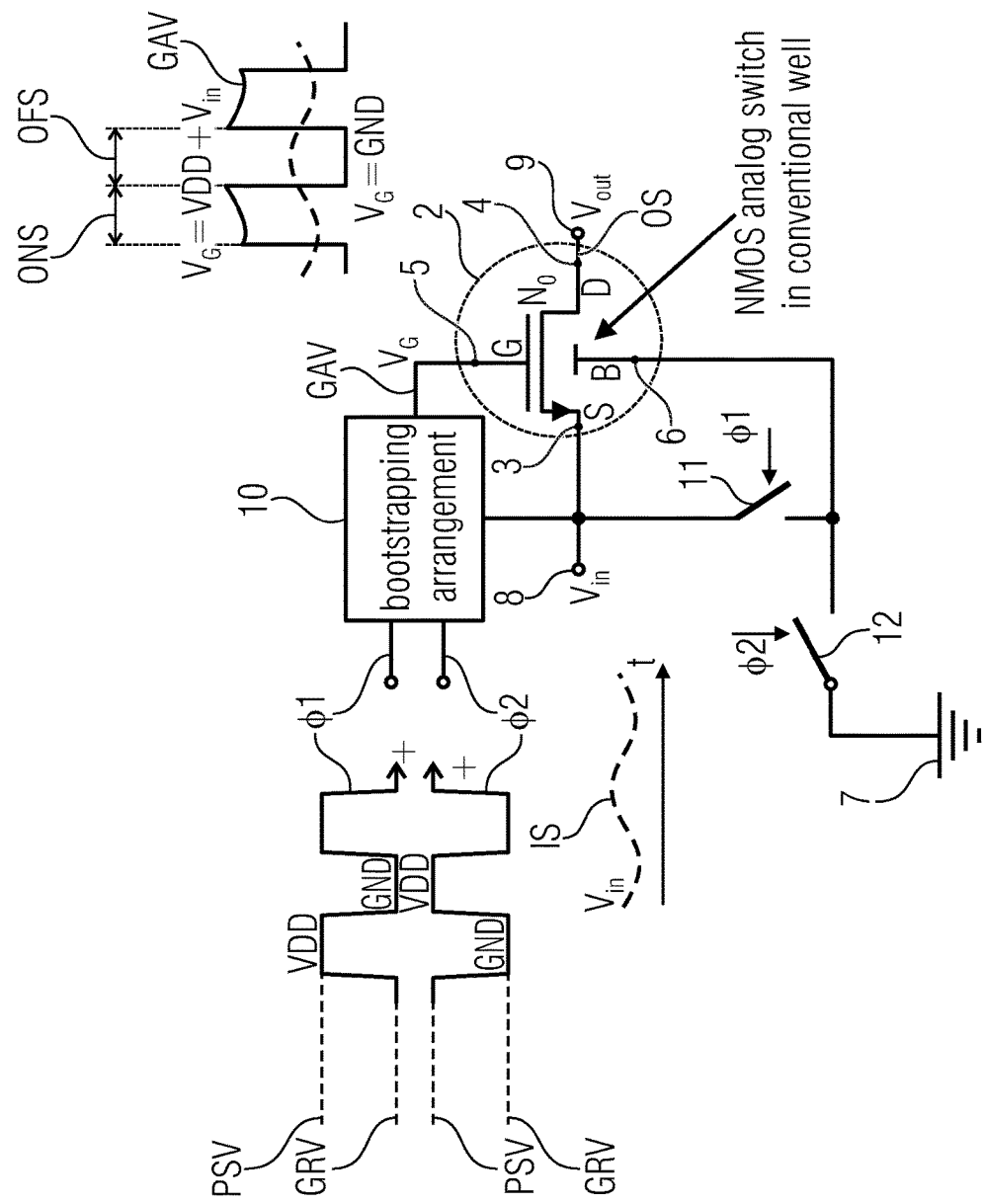
FIG. 2 illustrates a second embodiment of a switch device for switching an analog electrical input signal according to conventional technology in a schematic view.

FIG. 2 illustrates a second embodiment of a switch device for switching an analog electrical input signal according to conventional technology in a schematic view. The second embodiment is based on the first embodiment. However, the second embodiment differs from the first embodiment in that the bulk contact 6 is not permanently connected to the ground contact 7 as it is in the first embodiment. In the second embodiment the bulk contact 6 is connected to the source contact 3 of the switching transistor 2 during the on-state ONS via a switch 11. The switch 11 is controlled by the first binary control signal φ1 in such way that the switch 11 is closed when the first binary control signal φ1 is at the high level. Otherwise, during the off-state OFS, the bulk contact 6 is connected to the ground contact 7 via a further switch 12. The further switch 12 is controlled by the second binary control signal φ2 in such way that the switch 12 is closed when the second binary control signal φ2 is at the high level.

In the embodiment of FIG. 2 the bulk contact 6 is electrically connected to a p-well, which is electrically insulated from the p-substrate of the switching transistor 2 by a deep n-well. The bulk contact is shorted to the ground contact 6 during the off-state, when the switching transistor 2 is not conducting. During the on-state, it is shorted to the source contact 3. In this way the "Body-Effect" is avoided and an input-independent switch-resistance is obtained during the on-state. However, the deep n-well, which may be used to isolate the p-well from the p-type substrate, leads to more parasitic components and also to additional costs due to the requirement of an extra mask.

Figure 3:
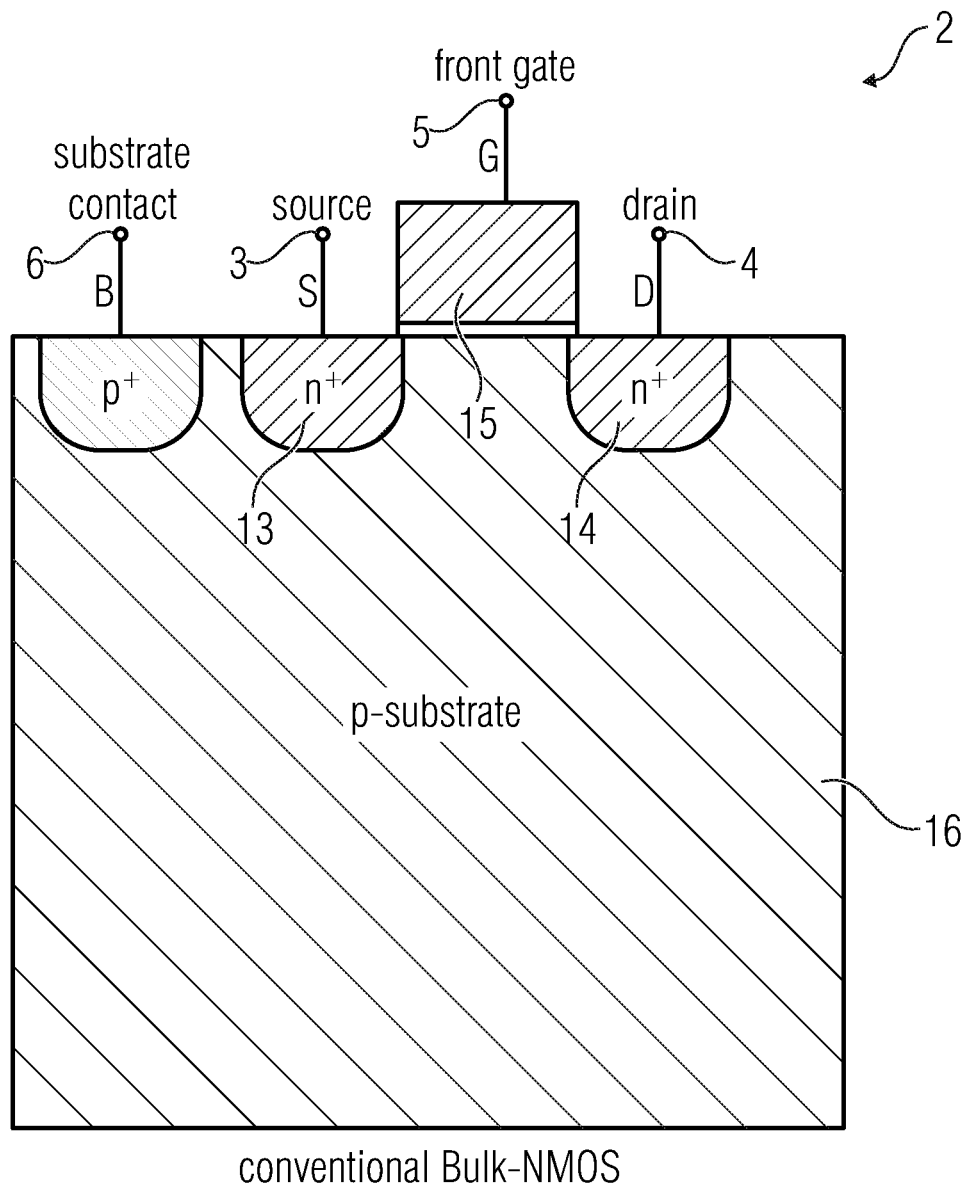
FIG. 3 illustrates an embodiment of a switching transistor being a conventional bulk-NMOS transistor as used in the switch devices shown in FIGS. 1 and 2 in a schematic view.

FIG. 3 illustrates an embodiment of a switching transistor 2 being a conventional bulk-NMOS transistor 2 as used in the switch device 1 shown in FIG. 1 in a schematic view. The source contact 3 is electrically connected to a source region 13, the drain contact 4 is electrically connected to a drain region 14, the front gate contact 5 is electrically connected to a gate region 15 and the bulk contact 6 is electrically connected to a bulk region 16. The bulk-NMOS transistor 2 would need an additional deep n-well in order to isolate an upper portion of the bulk region 16 serving as a p-well from a lower portion of the bulk region 16 serving as ground, in case that the switching transistor 2 should be used in the switch device 1 of FIG. 2.

Figure 4:
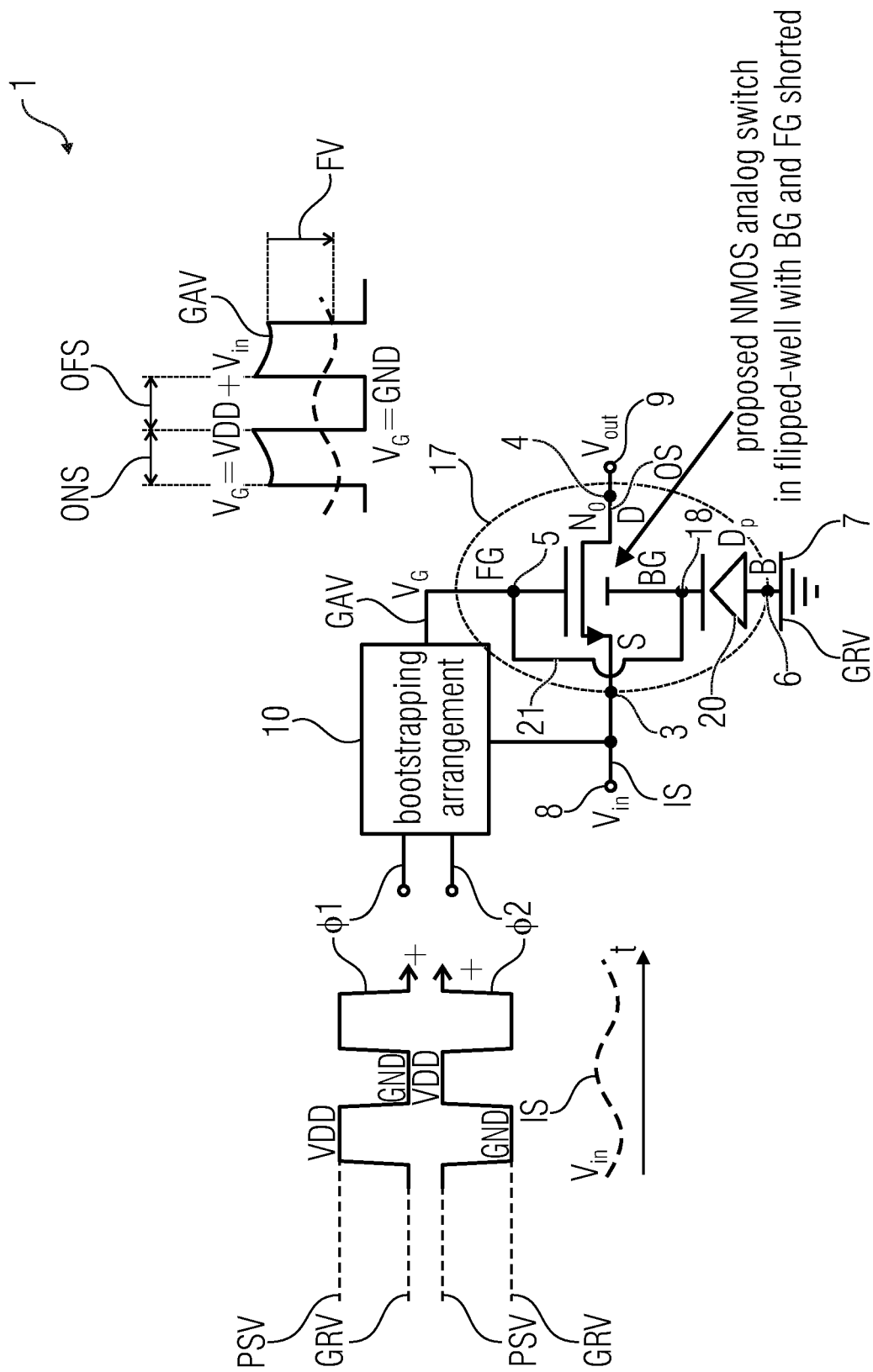
FIG. 4 illustrates an embodiment of a switch device for switching an analog electrical input signal according to the invention as a block diagram.

FIG. 4 illustrates an embodiment of a switch device 1 for switching an analog electrical input signal according to the invention as a block diagram. The switch device 1 comprises:

a switching transistor 17 being a flipped-well-silicon-on-insulator-NMOS transistor 17 comprising a source contact 3 being electrically connected to a source region 13, a drain contact 4 being electrically connected to a drain region 14, a front gate contact 5 being electrically connected to a gate region 15 and a back gate contact 18 being electrically connected to a flipped well 19 an input contact 8 for receiving the analog electrical input signal IS, wherein the input contact 8 is electrically connected to the source contact 3 of the switching transistor 17;

an output contact 9 for outputting an analog electrical output signal OS corresponding to the analog electrical input signal IS during an on-state ONS of the switch device 1 and for not outputting the analog electrical output signal OS during an off-state OFS of the switch device 1, wherein the output contact 9 is electrically connected to the drain contact 4 of the switching transistor 17; and a bootstrapping arrangement 10 comprising a voltage providing arrangement 23 for providing a constant floating voltage FV during the on-state ONS, wherein the floating voltage FV is provided at a positive terminal 24 and at a negative terminal 25 of the voltage providing arrangement 23;

wherein the bootstrapping arrangement 10 is configured in such way that during the on-state ONS the positive terminal 24 is electrically connected to the front gate contact 5 of the switching transistor 17 and to the back gate contact 18 of the switching transistor 17, and the negative terminal 25 is electrically connected to the source contact 3 of the switching transistor 17;

wherein the bootstrapping arrangement 10 is configured in such way that during the off-state OFS the positive terminal 24 and the negative terminal 25 are not electrically connected to the switching transistor 17.

The parasitic diode 20, formed at the junction between the n-well and the p-substrate of the NMOS is also shown in the illustration.

The bootstrapping arrangement 10 may provide a gate voltage GAV to the gate contact 5 of the switching transistor 17 in such way, that the gate voltage GAV is equal to a ground voltage GRV during the off-state OFS and that the gate voltage GAV is equal to the sum of a positive supply voltage PSV and the input signal IS during the on-state ONS.

The bootstrapping arrangement 10 may be controlled by a first binary control signal φ1, which is during the on-state ONS at a high level and during the off-state OFS at a low level, and a second binary control signal φ2, which is during the on-state ONS at a low level and during the off-state OFS at a high level. The low level may be for both signals φ1 and φ2 equal to the ground voltage GRV and the high-level may be for both signals φ1 and φ2 equal to the positive supply voltage PSV.

By controlling the back gate of the NMOS switching transistor 17, the conventional switch-bootstrapping technique [3] may be improved by obtaining a high linearity performance of the switch transistor 17 over a wide signal swing.

According to the invention the floating voltage FV produced by the bootstrapping arrangement 10 is applied during the on-state ONS not only to the front gate contact 5 of the switching transistor 17 but also to the back gate contact 18 of the switching transistor 17. In other words, the front gate contact 5 and the back gate contact 18 are shorted at least during the on-state ONS. With this innovative arrangement, both, the front gate contact 5 and the back gate contact 18 are bootstrapped to the source contact 3 during the on-state ONS, wherein a voltage is applied which is equal to the sum of the floating FV voltage and a voltage of the input signal IS.

This leads to an improvement of the performance of the switching transistor 17 because the potential difference between the back gate contact 18 and the source contact 3 is the floating voltage FV which is constant. Since there is no variation of the threshold voltage with the voltage of the input signal IS, the switch-resistance during the on-state ONS is also input-independent. A positive voltage between the back gate contact 18 and the source gate contact 3 leads to forward-body-biasing of the switching transistor 17. Due to this the threshold voltage of the switching transistor 17 is reduced during the on-state state ONS which results in a reduction of the switch-resistance during the on-state ONS. Hence, a target switch-resistance for the on-state of the switching transistor 17 can be achieved with a smaller aspect ratio (width/length). This results in the reduction of transistor-area dependent issues like clock-feedthrough [11] and charge-injection [11].

According to an advantageous embodiment of the invention the switch device 1 comprises a ground contact 7 for providing a ground voltage GRV;

wherein the bootstrapping arrangement 10 is configured in such way that during the on-state ONS the front gate contact 5 of the switching transistor 17 and the back gate contact 18 of the switching transistor 17 are not electrically connected to the ground contact 7;

wherein the bootstrapping arrangement 10 is configured in such way that during the off-state OFS the front gate contact 5 of the switching transistor 17 and the back gate contact 18 of the switching transistor 17 are electrically connected to the ground contact 17.

According to an advantageous embodiment of the invention the back gate contact 18 is electrically connected to the front gate contact 5 by a permanent electrical connection 21.

In a further aspect the invention provides a sampler for an analog/digital converter, wherein the sampler comprises a switching device 1 according to the invention.

In a further aspect the invention provides an analog/digital converter, wherein the analog/digital converter comprises a sampler according to the invention.

Figure 5:
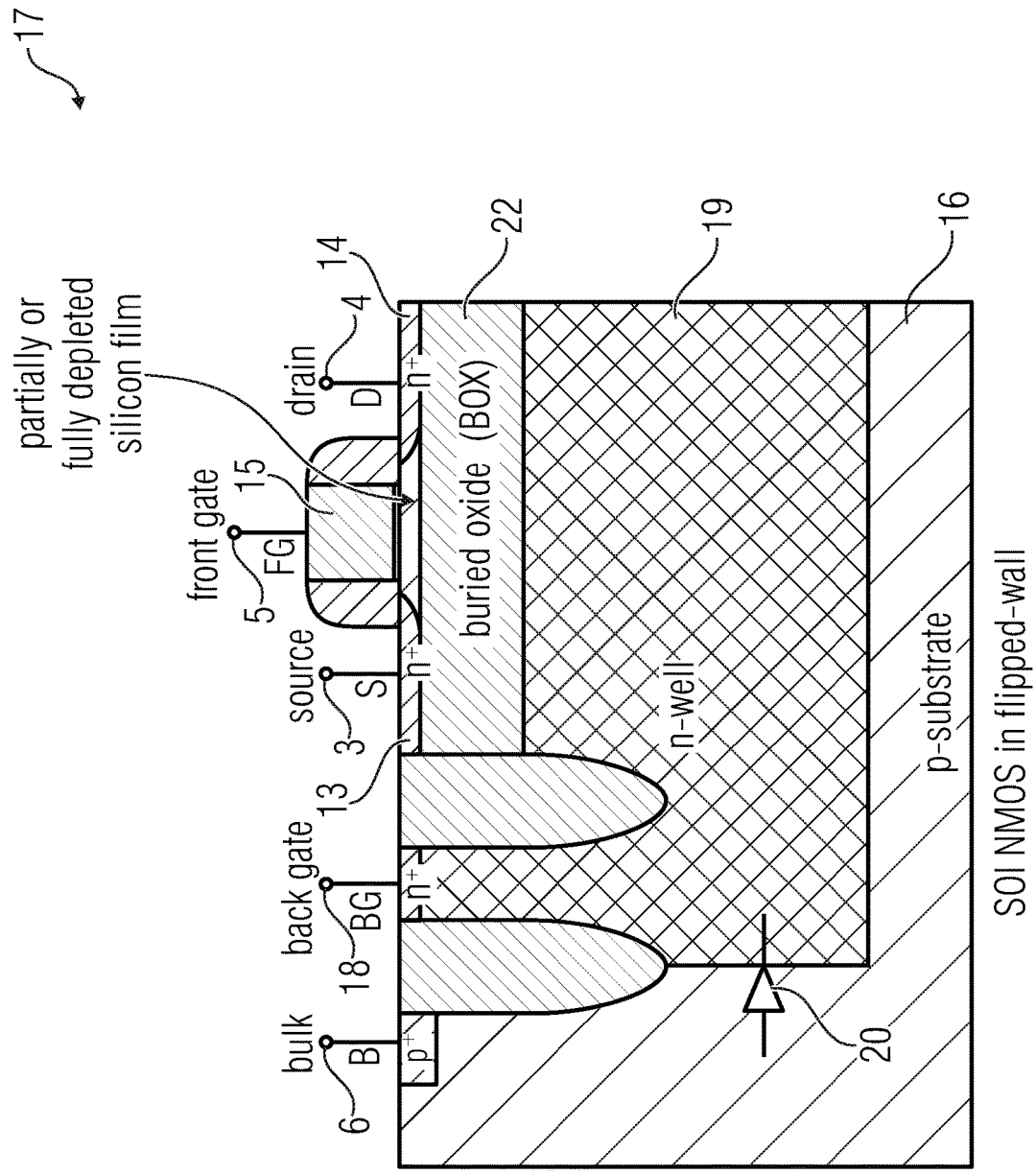
FIG. 5 illustrates an embodiment of a switching transistor being a flipped-well-silicon-on-insulator-NMOS transistor as used in the switch devices according to the invention in a schematic view.

FIG. 5 illustrates an embodiment of a switching transistor being a flipped-well-silicon-on-insulator-NMOS transistor as used in the switch devices according to the invention in a schematic view.

According to an advantageous embodiment of the invention the switching transistor 17 is a flipped-well fully depleted silicon-on-insulator NMOS transistor 17. Fully-depleted silicon-on-insulator technology has emerged as a cost-effective advanced process option that provides several benefits over its bulk counterparts [1, 2].

The fully-depleted silicon-on-insulator technology features devices fabricated in a planar process with a less than 7 nm thin silicon film on a buried oxide layer 22 [2]. FIG. 5 shows the cross section of devices in fully-depleted silicon-on-insulator technology. By the virtue of the buried oxide layer 22, these devices exhibit reduced leakage currents and provide robustness against latch-up. The buried oxide layer 22 isolates the well contact 18 of the device. This contact is called the back gate contact 18, whereas the conventional gate contact above the thin gate-oxide is referred to as the front-gate contact 5. An extended range of voltages can be applied at the back gate contact 18 to control the threshold voltage of the transistor 17 in such a way so as to strike a balance between optimum performance and power-efficiency as per the requirements of the applications.

Although the presented design is verified for a fully-depleted silicon-on-insulator, the same idea can be also used in other flavours of silicon-on-insulator based transistors, such as partially-doped silicon-on-insulator transistors.

According to an advantageous embodiment of the invention the switching transistor 17 comprises a buried insulator 22, wherein the source region 13, the drain region 14 and the gate region 15 are arranged at a first side of the buried insulator 22, and wherein the flipped-well 1 is arranged at a second side of the buried insulator 22.

According to an advantageous embodiment of the invention the switching transistor 17 comprises a substrate region 16, wherein the buried insulator 22 is arranged at a first side of the flipped-well 16, and wherein the substrate region 16 is arranged at a second side of the flipped well 16.

An NMOS transistor in flipped-well in 22 nm FDSOI technology may be used as the switching transistor 17. A flipped-well NMOS transistor is one where the active-NMOS device is placed in an n-well instead of a conventional p-well. Hence, the well is "flipped". The choice of a flipped-well NMOS in FD-SOI has the following advantages: The threshold voltage can be strongly controlled through the back gate contact 18 in flipped-well silicon-on-insulator transistors. Since bulk-NMOS transistors are placed in a p-well, this would also involve a deep n-well to isolate the back gate contact from the p-type substrate. This would lead to more parasitic components at the well-substrate junctions and also to additional costs due to the requirement of an extra mask. Due to a insulator, e.g. a buried oxide layer, a voltage of up to 2 V can be applied to the back gate of the transistor 17 [2]. A positive voltage of the back gate contact 18 with respect to the source contact 3 leads to lowering of threshold voltage. This is also known as forward-body-biasing.

Figure 6:
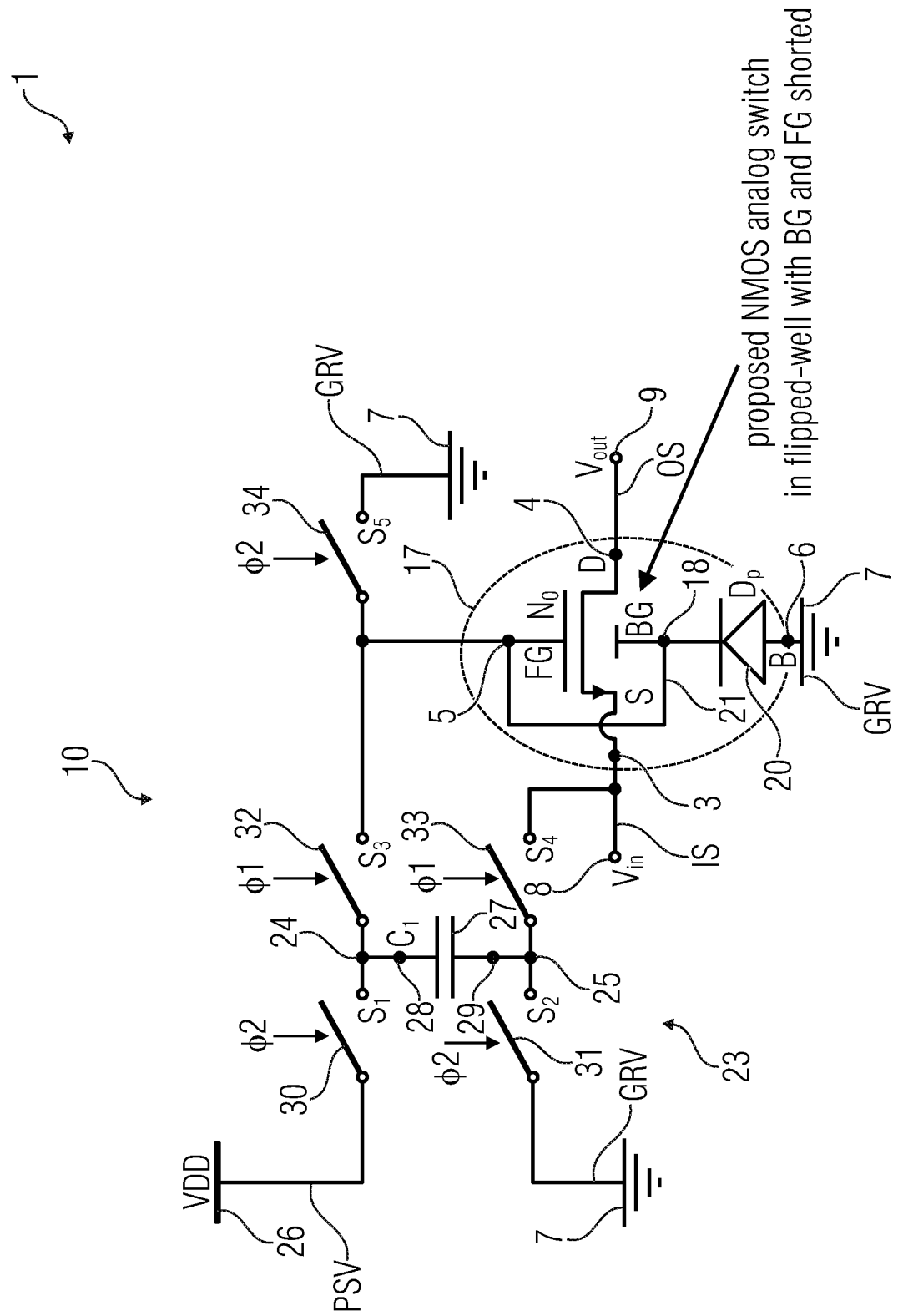
FIG. 6 illustrates an embodiment of a switch device for switching an analog electrical input signal according to the invention as a functional diagram.

FIG. 6 illustrates an embodiment of a switch device for switching an analog electrical input signal according to the invention as a functional diagram.

According to an advantageous embodiment of the invention the switch device 1 comprises a positive supply voltage contact 26 for providing a positive supply voltage PSV;
wherein the voltage providing arrangement 23 comprises a capacitor 26;
wherein the positive terminal 24 is electrically connected to a positive contact 28 of the capacitor 27;
wherein the negative terminal 25 is electrically connected to a negative contact 29 of the capacitor 27;
wherein the bootstrapping arrangement 10 is configured in such way that during the on-state ONS
the positive contact 28 of the capacitor 27 is not electrically connected to the positive supply voltage contact 26, and
the negative contact 29 of the capacitor 27 is not electrically connected to the ground contact 7;
wherein the bootstrapping arrangement 10 is configured in such way that during the off-state OFS
the positive contact 28 of the capacitor 27 is electrically connected to the positive supply voltage contact 26, and
the negative contact 29 of the capacitor 27 is electrically connected to the ground contact 7.

According to an advantageous embodiment of the invention the bootstrapping arrangement 10 comprises a first switch 30 for electrically connecting the positive contact 28 of the capacitor 27 to the positive supply voltage contact 25;
wherein the bootstrapping arrangement 10 comprises a second switch 31 for electrically connecting the negative contact 29 of the capacitor 27 to the ground contact 7;
wherein the bootstrapping arrangement 10 comprises a third switch 32 for electrically connecting the positive contact 28 of the capacitor 27 to the front gate contact 5 of the switching transistor 17 and to the back gate contact 18 of the switching transistor 17;
wherein the bootstrapping arrangement 10 comprises a fourth switch 33 for electrically connecting the negative contact 29 of the capacitor 27 to the source contact 3 of the switching transistor 17;
wherein the bootstrapping arrangement 10 comprises a fifth switch 34 for electrically connecting the ground contact 7 to the front gate contact 5 of the switching transistor 17 and to the back gate 18 contact of the switching transistor 17.

As mentioned before it is proposed to implement the NMOS switch transistor 17 in such way that it has a flipped well 19 that its back gate contact 18 and the front gate contact 5 are shorted together, hence, the switch device could be named "back-gate-and-front-gate bootstrapped switch". The parasitic diode 20, formed at the junction between the n-well and the p-substrate of the NMOS is also shown in the illustration. During the non-conducting off-state OFS the first switch 30 and the second switch 31 are closed and the capacitor 27 is charged to the positive supply voltage. During the conducting on-state ONS, the capacitor 27 is connected between the gate contacts 5 and 18 and the source contact of switching transistor 17 by the third switch 32 and the fourth switch 33. This results in bootstrapping of both the front gate contact 5 and the back gate contact 18 to the source contact 3. This topology improves the switch linearity over the conventional bootstrapped switch, where only the front gate contact 5 is bootstrapped to the source contact 3, because of two reasons:

i) forward-body-biasing reduces the voltage threshold, thereby, reducing the switch-resistance of switching transistor 17 during the on-state, and ii) since the back gate contact 18 also tracks the input signal IS, threshold voltage variations dependent on the input signal IS are removed resulting in an input-independent switch-resistance during the on-state. Additionally, the reduction of threshold voltage due to forward-body-biasing during the on-state allows the switching transistor 17 to have a low switch-resistance during the on-state with a relatively small aspect ratio (width/length).

According to an advantageous embodiment of the invention the switches 30, 31, 32, 33, 34 are controlled by one or more binary control signals ϕ1, ϕ2.

Figure 7:
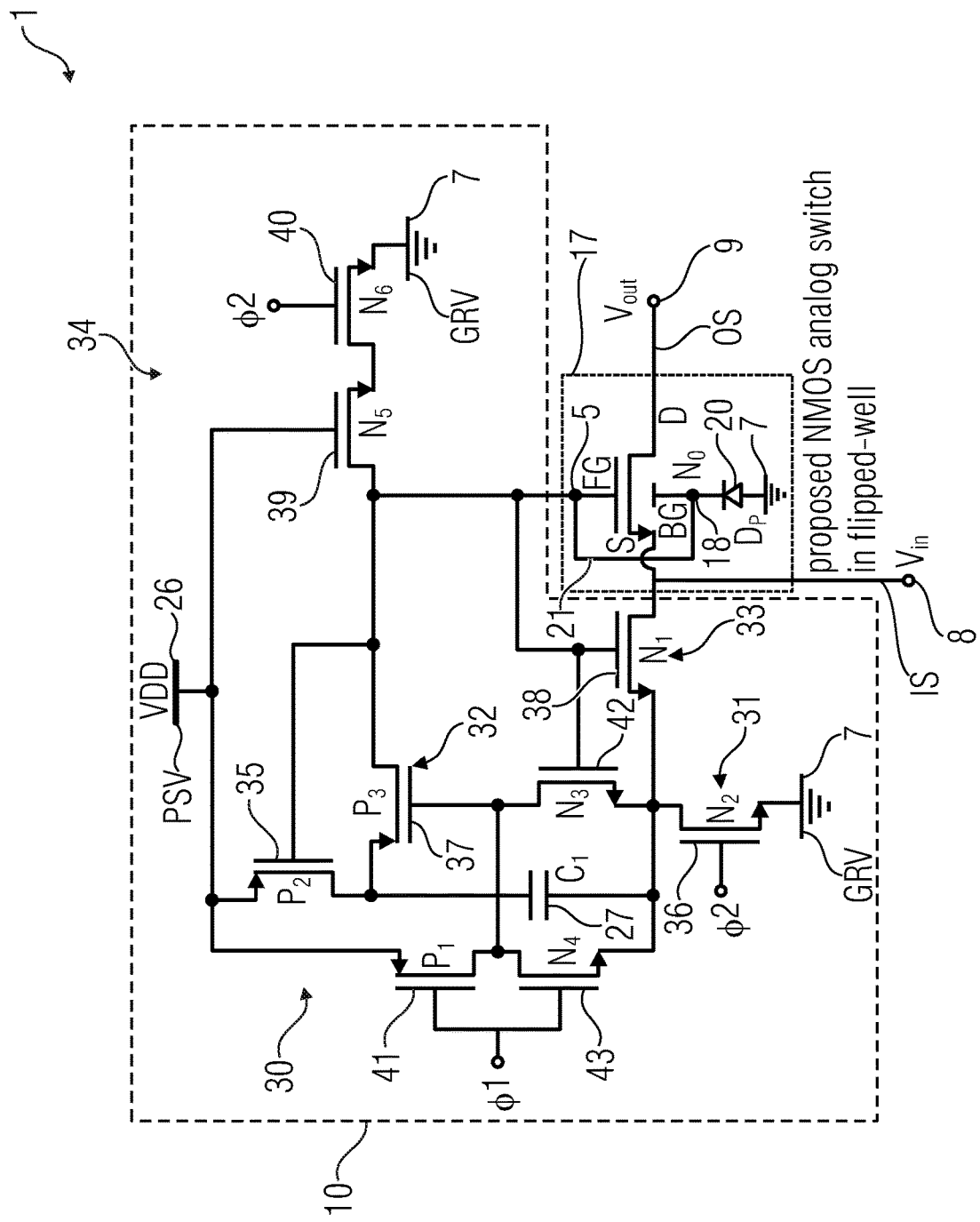
FIG. 7 illustrates an embodiment of a switch device for switching an analog electrical input signal according to the invention as a circuit diagram.

FIG. 7 illustrates an embodiment of a switch device 1 for switching an analog electrical input signal IS according to the invention as a circuit diagram. The bootstrapping arrangement 10 is similar to bootstrapping arrangements described in [6] and [12]. However, the performance of the proposed switch device 1 is improved by combining such bootstrapping arrangement 10 with switching transistor 17 as described herein. The circuit diagram of FIG. 7 and the functional diagram of FIG. 6 represent the same switch device 1.

However, it has to be noted that the circuit diagram of FIG. 7 is just an example for an implementation of the switch device according to the block diagram of FIG. 6.

To implement the switching scheme of the proposed bootstrapped switch device 1, the topology similar to the one presented in [6] may be chosen because it does not require additional clock boosting. FIG. 7 illustrates the implementation of the switch topologies. A major challenge in the circuit implementation of the switch-bootstrapping topology is maintaining reliable operation of all the switches 30, 31, 32, 33, 34 due to the generation of internal voltage levels beyond the positive supply voltage PSV. By the virtue of the buried insulator 22, the back gate contacts 18 of silicon-on-insulator transistors 17 may support voltage levels up to 2 V. Since the internal voltage levels are below this limit, the back gate contact 18 of transistor 17 may be shorted to the ground contact 7 without leading to dielectric breakdown.

The first switch 30 is realized as a PMOS transistor 35. Furthermore, the second switch 31 is realized as an NMOS transistor 36. The third switch 32 corresponds to a PMOS transistor 37. The fourth switch 33 is represented by an NMOS transistor 38 and the 5th switch 34 by NMOS transistor 40. NMOS transistor 39 ensures reliable operation of NMOS transistor 40 by protecting it from voltage levels beyond the positive supply voltage PSV.

Each of transistors 35, 36, 37, 38, 39, 40, 41, 42 may be a FDSOI transistor 35, 36, 37, 38, 39, 40, 41, 42 so that the back-gate contact of each of the transistors 35, 36, 37, 38, 39, 40, 41, 42 may be shorted to ground contact without causing dielectric breakdown.

In order to turn on and off PMOS transistor 37 sufficiently during the on-state ONS and the off-state OFS respectively, the gate of PMOS transistor 37 is controlled by the help of PMOS transistor 41, NMOS transistor 42 and NMOS transistor 43. So, PMOS transistor 37 in FIG. 7 corresponds to the first switch 32 in FIG. 6. Although PMOS transistor 41, NMOS transistor 42 and NMOS transistor 43 do not correspond to any of the switches 30, 31, 32, 33 and 34 of FIG. 6, they may be used for the reliable operation of the PMOS transistor 37.

The gate of 38 is also controlled by the same signal as gate of the switching transistor switch 17.

As seen in FIG. 6, the terminal of switch 34, which is not shorted to the ground contact 7 during the on-state ONS, experiences a voltage of the sum of the positive supply voltage PSV and the voltage of the input signal IS during the on-state ONS as the floating voltage FV of the capacitor has the same value as the positive supply voltage PSV. This can cause reliability problems if switch 34 is implemented with only one NMOS transistor 40. This is because, during the during the on-state ONS, for positive values of the voltage of the input signal IS, a potential difference greater than the nominal positive supply voltage PSV is experienced across the gate-oxide and the channel of NMOS transistor 40. To solve this problem, NMOS transistor 39 is added with its gate shorted to the positive voltage supply contact 26 as seen in FIG. 7. This allows the sum of the positive supply voltage PSV and the voltage of the input signal IS during the on-state ONS to drop partially across NMOS transistor 39. Hence, the gate-oxide and the channel of NMOS transistor 40 are not electrically overstressed.

Figure 8:
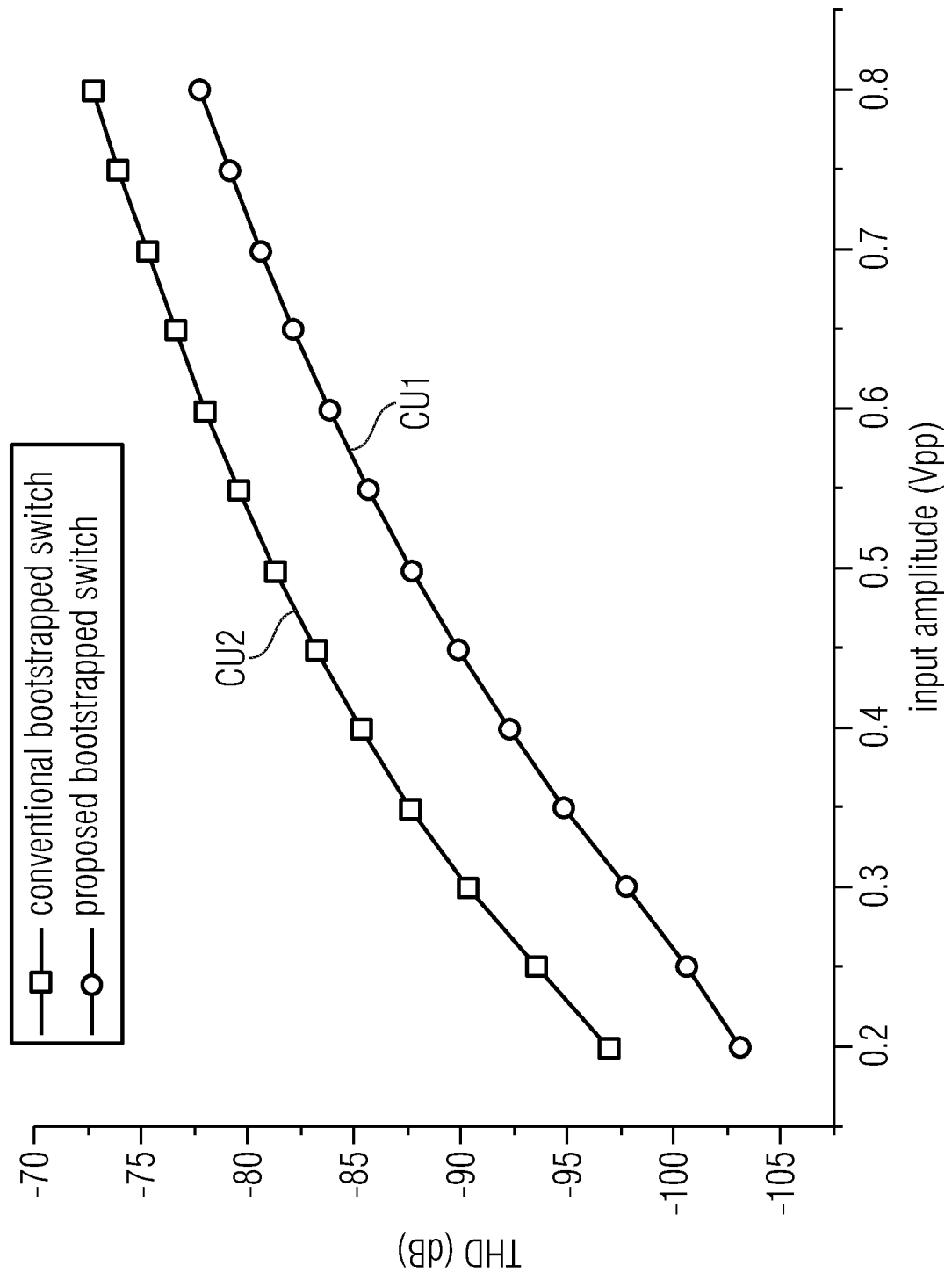
FIG. 8 illustrates simulation results of the total-harmonic-distortion of the switch device according to the invention and of the switch device according to conventional technology.

FIG. 8 illustrates simulation results of the total-harmonic-distortion of the switch device 1 according to the invention and of the switch device 1 according to conventional technology. A first curve CU1 shows the total-harmonic-distortion of the switch device 1 according to the invention depending on the peak-to-peak amplitude of the input signal IS. A second curve CU2 shows the total-harmonic-distortion of the switch device 1 according to conventional technology depending on the peak-to-peak amplitude of the input signal IS.

A basic differential sample-and-hold circuit comprising the switch device 1 and a load capacitor is used to verify the performance. The width of the respective switching transistor 2 or 17, is determined for the minimum channel length to achieve during the on-state ONS approximately a resistance of 300Ω for a 5 pF load capacitor clocked with a Nyquist-sampling frequency of 20 MHz. The nominal positive supply voltage PSV is 0.8 V and input common-mode voltage is 400 mV. FIG. 8 shows the total-harmonic-distortion (THD) of the sampled signal OS calculated for the input signal IS having a frequency of 9.5 MHz, which is close to the Nyquist-bandwidth, across a wide range of amplitudes. It can be observed from the plot that as compared to the conventional switch device 1, a significant improvement in linearity during conduction is achieved by the switch device 1 according to the invention.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The research leading to these results has received funding from the European Union.

REFERENCES

[1] O. Weber et al., "14 nm FDSOI technology for high speed and energy efficient applications," 2014 Symposium on VLSI Technology (VLSI-Technology): Digest of Technical Papers, Honolulu, HI, 2014, pp. 1-2.

[2] R. Carter et al., "22 nm FDSOI technology for emerging mobile, Internet-of-Things, and RF applications," 2016 IEEE International Electron Devices Meeting (IEDM), San Francisco, Calif., 2016, pp. 2.2.1-2.2.4.

[3] B. Razavi, "The Bootstrapped Switch [A Circuit for All Seasons]," in IEEE Solid-State Circuits Magazine, vol. 7, no. 3, pp. 12-15, Summer 2015.

[4] U. Moon et al., "Switched-capacitor circuit techniques in submicron low-voltage CMOS," VLSI and CAD, 1999. ICVC '99. 6th International Conference on, Seoul, 1999, pp. 349-358.

[5] J. Steensgaard, "Bootstrapped low-voltage analog switches," Circuits and Systems, 1999. ISCAS '99. Proceedings of the 1999 IEEE International Symposium on, Orlando, Fla., 1999, pp. 29-32 vol.2.

[6] M. Dessouky and A. Kaiser, "Input switch configuration suitable for rail-to-rail operation of switched op amp circuits," in Electronics Letters, vol. 35, no. 1, pp. 8-10, 7 Jan. 1999.

[7] J. Brunsilius et al., "A 16b 80MS/s 100 mW 77.6 dB SNR CMOS pipeline ADC," 2011 IEEE International Solid-State Circuits Conference, San Francisco, Calif., 2011, pp. 186-188.

[8] B. Nikolic et al., Circuit Design in Nanoscale FDSOI Technologies, MIEL 2014, Belgrade, Serbia, 12-14 May, 2014.

[9] UTBB-FDSOI Design & Migration Methodology, STMicroelectronics

[10] Huang, Guanzhong, and Pingfen Lin. "A fast bootstrapped switch for high-speed high-resolution A/D converter." Circuits and Systems (APCCAS), 2010 IEEE Asia Pacific Conference on. IEEE, 2010.

[11] U.C. Berkeley, EE247, Lecture 19, ADC Converters, Lecture Notes, 2006.

[12] Chun-Cheng Liu, Soon-Jyh Chang, Guan-Ying Huang, Ying-Zu Lin "A 10-bit 50-MS/s SAR ADC With a Monotonic Capacitor Switching Procedure", in IEEE Journal of Solid-State Circuits, Volume: 45, Issue: 4, April 2010.

The invention claimed is:

1. A switch device for switching an analog electrical input signal, the switch device comprising:
a switching transistor being a flipped-well-silicon-on-insulator-NMOS transistor comprising a source contact being electrically connected to a source region, a drain contact being electrically connected to a drain region, a front gate contact being electrically connected to a gate region and a back gate contact being electrically connected to a flipped well;
an input contact for receiving the analog electrical input signal, wherein the input contact is electrically connected to the source contact of the switching transistor;
an output contact for outputting an analog electrical output signal corresponding to the analog electrical input signal during an on-state of the switch device and for not outputting the analog electrical output signal during an off-state of the switch device, wherein the output contact is electrically connected to the drain contact of the switching transistor; and
a bootstrapping arrangement comprising a voltage providing arrangement for providing a constant floating voltage during the on-state, wherein the floating voltage is provided at a positive terminal and at a negative terminal of the voltage providing arrangement;
wherein the bootstrapping arrangement is configured in such way that during the on-state;
the positive terminal is electrically connected to the front gate contact of the switching transistor and to the back gate contact of the switching transistor, and
the negative terminal is electrically connected to the source contact of the switching transistor;
wherein the bootstrapping arrangement is configured in such way that during the off-state;
the positive terminal and the negative terminal are not electrically connected to the switching transistor.

2. The switch device according to claim 1, wherein the switch device comprises a ground contact for providing a ground voltage;
wherein the bootstrapping arrangement is configured in such way that
during the on-state the front gate contact of the switching transistor and the back gate contact of the switching transistor are not electrically connected to the ground contact;
wherein the bootstrapping arrangement is configured in such way that during the off-state
the front gate contact of the switching transistor and the back gate contact of the switching transistor are electrically connected to the ground contact.

3. The switch device according to claim 2, wherein the switch device comprises a positive supply voltage contact for providing a positive supply voltage;
wherein the voltage providing arrangement comprises a capacitor;
wherein the positive terminal is electrically connected to a positive contact of the capacitor;
wherein the negative terminal is electrically connected to a negative contact of the capacitor;
wherein the bootstrapping arrangement is configured in such way that during the on-state
the positive contact of the capacitor is not electrically connected to the positive supply voltage contact, and
the negative contact of the capacitor is not electrically connected to the ground contact;
wherein the bootstrapping arrangement is configured in such way that during the off-state
the positive contact of the capacitor is electrically connected to the positive supply voltage contact, and
the negative contact of the capacitor is electrically connected to the ground contact.

4. The switch device according to claim 3, wherein the bootstrapping arrangement comprises a first switch for electrically connecting the positive contact of the capacitor to the positive supply voltage contact;
wherein the bootstrapping arrangement comprises a second switch for electrically connecting the negative contact of the capacitor to the ground contact;
wherein the bootstrapping arrangement comprises a third switch for electrically connecting the positive contact of the capacitor to the front gate contact of the switching transistor and to the back gate contact of the switching transistor;
wherein the bootstrapping arrangement comprises a forth switch for electrically connecting the negative contact of the capacitor to the source contact of the switching transistor;
wherein the bootstrapping arrangement comprises a fifth switch for electrically connecting the ground contact to the front gate contact of the switching transistor and to the back gate contact of the switching transistor.

5. The switch device according to claim 4, wherein the switches are controlled by one or more binary control signals.

6. The switch device according to claim 1, wherein the switching transistor is a flipped-well fully depleted silicon-on-insulator NMOS transistor.

7. The switch device according to claim 1, wherein the switching transistor comprises a buried insulator, wherein the source region, the drain region and the gate region are arranged at a first side of the buried insulator, and wherein the flipped-well is arranged at a second side of the buried insulator.

8. The switch device according to claim 1, wherein the switching transistor comprises a substrate region, wherein the buried insulator is arranged at a first side of the flipped-well, and wherein the substrate region is arranged at a second side of the flipped wall.

9. The switch device according to claim 1, wherein the back gate contact is electrically connected to the front gate contact by a permanent electrical connection.

10. A sampler for an analog/digital converter, wherein the sampler comprises a switching device according to claim 1.

11. An analog/digital converter, wherein the analog/digital converter comprises a sampler according to claim 10.

* * * * *